United States Patent [19]
Hudson

[11] Patent Number: 5,768,759
[45] Date of Patent: Jun. 23, 1998

[54] METHOD AND APPARATUS FOR REFLECTIVE IN-FLIGHT COMPONENT REGISTRATION

[75] Inventor: Edison T. Hudson, Chapel Hill, N.C.

[73] Assignee: Zevatech, Inc., Morrisville, N.C.

[21] Appl. No.: 753,037

[22] Filed: Nov. 19, 1996

[51] Int. Cl.[6] .................................................. B23Q 17/00
[52] U.S. Cl. ...................... 29/407.04; 29/407.1; 29/771; 29/739; 29/833
[58] Field of Search ........................ 29/407.01, 407.04, 29/407.09, 407.1, 430, 701, 702, 703, 705, 739, 771, 783, 791, 833, 834; 364/150; 250/222.1

[56] References Cited

U.S. PATENT DOCUMENTS

| | | |
|---|---|---|
| 3,337,941 | 8/1967 | Drop . |
| 3,487,226 | 12/1969 | Yetter et al. ......................... 250/222.1 |
| 3,622,396 | 11/1971 | Fernandez et al. .................. 250/222.1 |
| 3,624,401 | 11/1971 | Stoller ................................. 250/222.1 |
| 3,854,052 | 12/1974 | Asar et al. . |
| 3,876,877 | 4/1975 | Meulensteen et al. .............. 250/222.1 |
| 4,092,719 | 5/1978 | Salmon ..................................... 29/712 |
| 4,144,449 | 3/1979 | Funk et al. ........................... 250/222.1 |
| 4,151,945 | 5/1979 | Ragard et al. . |
| 4,247,767 | 1/1981 | O'Brien et al. ....................... 250/222.1 |
| 4,346,293 | 8/1982 | Fetzer .................................. 250/222.1 |
| 4,383,359 | 5/1983 | Suzuki et al. ............................. 29/712 |
| 4,615,093 | 10/1986 | Tews et al. .......................... 29/407.04 |
| 4,741,621 | 5/1988 | Taft et al. . |
| 5,046,851 | 9/1991 | Morgan . |
| 5,195,234 | 3/1993 | Pine et al. ................................ 29/739 |
| 5,249,239 | 9/1993 | Kida . |
| 5,278,634 | 1/1994 | Skunes et al. . |
| 5,309,223 | 5/1994 | Konicek et al. . |
| 5,311,304 | 5/1994 | Monno .................................... 29/833 |
| 5,559,727 | 9/1996 | Deley et al. . |

FOREIGN PATENT DOCUMENTS 2 183 820  6/1987  United Kingdom .

*Primary Examiner*—David P. Bryant
*Attorney, Agent, or Firm*—D'Alessandro & Ritchie

[57] ABSTRACT

An "on-the-fly" component registration system comprises a two-dimensional imaging camera carried by a component placement nozzle platform in turn carried by a positioning gantry. A reflective surface located on or adjacent to a workpiece on which a component is to be placed allows the camera to image by reflection therefrom the component held by the component placement nozzle and an associated machine vision system to determine position correction information (e.g., $\Delta x$, $\Delta y$ and $\Delta \theta$) therefrom while the component placement nozzle platform is traveling on the positioning gantry from a component supply station, by the reflective surface, on the way to a component placement target position on the workpiece.

21 Claims, 3 Drawing Sheets

METHOD AND APPARATUS FOR REFLECTIVE IN-FLIGHT COMPONENT REGISTRATION

BACKGROUND OF THE INVENTION

1. Field of the Invention

This invention is directed generally to the field of devices for robotically mounting electrical components to printed circuit boards, substrates or other workpieces. More particularly, the present invention is directed to an apparatus and method for picking a component up from a supply source and placing it upon a printed circuit board, substrate, or other workpiece using in-flight component registration to achieve "on-the-fly" component centering.

2. The Prior Art

In electronic circuitry manufacturing, it is well known in the art to use an automatic or robotic apparatus to pick up electronic components such as resistors, capacitors, integrated circuits and the like from a component supply source (e.g., component supply feeders, magazines, and component bins) and place such components on a printed circuit board or on another substrate provided with a conductive pattern thereon and/or therein (collectively referred to as "workpiece"). The components are inserted into holes (through hole technology) or placed onto conductive pads (surface mount and flip-chip technology) provided in/on the workpiece. To achieve an economical manufacturing process in electronic circuitry, automatic assembly machines (also known as pick-and-place systems) that are controlled by a suitable program, as is well known to those of ordinary skill in the art, automatically pick up selected components from the component supply source and transport those components to a desired location on the workpiece. The automatic assembly machine then places the components on the workpiece at a predetermined location in a predetermined orientation. One popular type of automatic assembly machine positions one or more vacuum nozzles over a cartesian x-y plane wherein the nozzles are used to travel to a component supply source such as a component feeder, pick up a component, properly orient the component, carry it to the workpiece, and precisely place the component in its designated location with the electrically conductive component leads of the component properly oriented so that after a reflow soldering process they will make proper electrical contact with the preformed circuit traces of the workpiece.

In normal use, a pick-up and retaining member of the automatic assembly machine (such as a vacuum nozzle) picks up the component from the component supply source. The tape reels upon which many components are provided for manufacture into printed circuit boards and the nature of the vacuum pick up process lend themselves to positional error in that the nozzle has a position axis and the position of the component may deviate away from a predetermined nominal position on the nozzle relative to the position axis. Thus, once the component has been picked up by the vacuum nozzle, some correction needs to be made for positional error in order that the component will be placed accurately on the workpiece. Thinking of the workpiece as defining an x-y cartesian plane and the nozzle orthogonal to that x-y plane and extending along the z-axis, the error may be thought of as having three components: a $\Delta x$ component, a $\Delta y$ component and a $\Delta \theta$ component. The $\Delta x$ component refers to the distance (either positive or negative) that the component center or predetermined nominal position is displaced along the "x" axis from the position axis; the $\Delta y$ component refers to the distance (either positive or negative) that the component center or predetermined nominal position is displaced along the "y" axis from the position axis; and the $\Delta \theta$ component refers to the angular rotation of the component (either clockwise or counterclockwise) about the "z" axis (along the nozzle) from a predetermined nominal angular orientation.

With today's high density integrated circuits often having hundreds of electrical contacts in a space smaller than a square centimeter, the electrical components must be placed precisely on the circuit board, thus requiring correct angular orientation and lateral positioning, or else the finished device may not work.

Various apparatus and methods have been utilized in the past to correct the deviation of the component from the desired nominal position on the nozzle. A first type of apparatus that has been used in the past places an electronic camera on or adjacent to the workpiece in a fixed position. A component placement nozzle platform supported by a gantry is used to position the component on the nozzle in two dimensions (x,y) above the workpiece. The nozzle is moveable along the z-axis orthogonal to the x, y plane. The nozzle picks up a component, travels to the fixed camera station, the camera and associated machine vision system determines positional and angular corrections (correction information) from a nominal position based on viewing the component held by the nozzle while looking up from below the nozzle. The platform then positions the nozzle above the workpiece at the position where the component is to be placed. Subsequently or simultaneously the platform is then corrected in position and the nozzle rotated based upon a control signal determined from the correction information calculated by the machine vision system and the nozzle is extended and the vacuum supply cut off so as to place the component on the workpiece at the precisely desired position. While fit for its intended purpose, this type of system requires that the platform go from pick up position to vision station position to target location on the workpiece rather than directly from the pick up position to the target location on the workpiece. The result is extra travel and a consequent reduction in the speed of throughput over a system that could avoid the vision station waypoint.

U.S. Pat. No. 4,615,093 to Tews et al. and entitled "Method and an Apparatus for the Positioning of Components with Reference to a Workpiece" (hereby incorporated by reference as if set forth fully herein) overcame the problem of travel to a vision station with an "on-the-fly" component registration system. In essence, the Tews et al. system provides a plurality of light beams which are projected at the component in or near the plane in which the component is located while it is held by the nozzle. Detectors in the same plane as the light source sense light that passes by the component and do not sense light occulted by the component. In conjunction with rotation of the component through the light beam and the known shape of the particular component, a processor then determines the correction information for the component. The correction information is then fed to appropriate portions of the pick and place system and the component is precisely placed on the work piece. While this system has worked well and achieved enormous commercial success, as component lead densities have climbed, limits of this system have come to be recognized, particularly a lack of resolution due to the finite number of light emitting elements and detectors that can be packed into such a planar sensor unit and limitations in its ability to detect ultra-small features. In particular, newer flip-chip type components are best registered using their bump or die patterns on the bottom of the package. This has not proved to be possible with laser or blocked-light methods such as Tews et al. because the features of interest (i.e., the bumps) have almost no height dimension and will not occlude a plane of illumination. Die patterns and very low profile flip-chip bumps are therefore best located using an optical image as obtained with a camera rather than with blocked-light type techniques such as taught by Tews et al. Accordingly, there is a need for an improved resolution "on-the-fly" type of component registration system to aid in the placement of the extremely high density electrical components which are now beginning to enter the market.

SUMMARY OF THE INVENTION

An "on-the-fly" component registration system comprises a two-dimensional imaging camera carried by a component placement nozzle platform in turn carried by a positioning gantry. A reflective surface located on or adjacent to a workpiece on which a component is to be placed allows the camera to image by reflection therefrom the component held by the component placement nozzle and an associated machine vision system to determine position correction information (e.g., $\Delta x$, $\Delta y$ and $\Delta \theta$) therefrom while the component placement nozzle platform is traveling on the positioning gantry from a component supply station, by the reflective surface, on the way to a component placement target position on the workpiece.

OBJECTS AND ADVANTAGES OF THE INVENTION

Accordingly, it is an object and advantage of the present invention to provide a method and apparatus for the positioning of components with reference to a workpiece which overcomes some of the shortcomings of the prior art.

Another object and advantage of the present invention is to provide a method and apparatus for placing components picked-up from a component supply source onto or into a workpiece at a preselected position while determining position correction information during movement from the supply source to the workpiece without the need to travel to a fixed component imaging station.

Another object and advantage of the present invention is to provide a method and apparatus for accurately positioning components on a workpiece by utilizing a camera element located on a component placement nozzle platform positioned by a positioning gantry, the camera able to image the component while travelling over a reflective surface positioned on or adjacent to the workpiece, and an associated machine vision system adapted to determine component position correction information based upon images captured from said camera.

Another object and advantage of the present invention is to provide a method and apparatus for the positioning of electric or electronic components with reference to a printed circuit board, a circuit substrate, or other workpiece.

Another object and advantage of the present invention is to provide a method and apparatus for the positioning of components with reference to a workpiece in which the method does not require the use of a mechanical or light blocking type of centering device, but nevertheless guarantees a quick positioning of the components on or into the workpiece.

A further object and advantage of the present invention is that it permits the registration of flip-chip type components using an on-the-fly methodology rather than a separate vision station as required in the prior art.

Still another object of the present invention is that a single camera disposed on the component placement nozzle platform can perform both component registration tasks as well as conventional substrate alignment tasks.

These and many other objects and advantages of the present invention will become apparent to those of ordinary skill in the art from a consideration of the drawings and ensuing description of the invention.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

Figure 1:
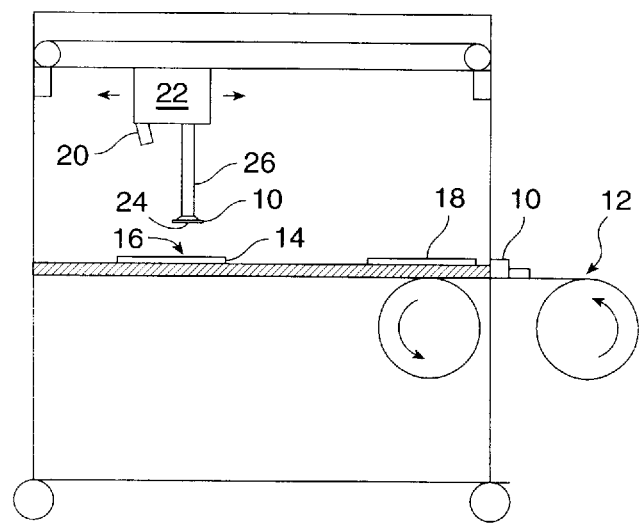
FIG. 1 is a diagram showing a side view of a pick and place machine according to a presently preferred embodiment of the present invention.

Turning now to FIG. 1, a pick and place system utilizing the present invention is depicted. The apparatus and method of the present invention provide a mechanism for repeatedly removing components 10 from a component supply source 12 (also known as a "component storage means"), transporting these components to a workpiece 14, and putting those components onto or into the workpiece 14 at a component target location 16. The component supply source 12 can be component supply feeders, magazines, component bins, or any other similar component supply apparatus as are well known to those of ordinary skill in the art. The workpiece 14 can be printed circuit boards, ceramic substrates for hybrid circuits, multi-chip modules (MCMs) or other workpieces as known to those of ordinary skill in the art.

The present invention permits the optical registration (i.e., determination of deviation of the actual position from a predetermined nominal position axis) of a component's x, y position and angular orientation on a pick-up nozzle 26 (part of a "component transporting means"), while the nozzle 26 travels from the component supply source 12 over a reflective surface 18 to a component target location 16 on the workpiece 14. According to a presently preferred embodiment of the present invention, a conventional miniature CCD-type camera 20 (any miniature camera or imaging system would work), mounted on component placement nozzle platform 22, is used to capture the image of the bottom side 24 of a component 10. Component 10 is preferably held on nozzle 26 of component placement nozzle platform 22 by means of vacuum pressure applied to component 10 through nozzle 26 in a convention manner well known to those of ordinary skill in the art. Image capture is accomplished by using a stationary flat reflective surface 18 which is preferably located and sized so that nozzle 26 will pass over it on each trip between the component supply source 12 and the workpiece 14. In this manner, camera 20 can image bottom side 24 of component 10 while component 10 is "in-flight" as the moving component placement nozzle platform 22 carries component 10 from component supply source 12 to a component target location 16 on the workpiece 14. Reflective surface 18 must be of a size and quality to provide a continuous, non-varying image as the component 10 is moved over reflective surface 18. Conventional mirrors may be used in this application for reflective surface 18.

A key feature of this approach is that the position of the component 10 on the nozzle 26 can be captured by the camera as though it were stationary, i.e., as if the nozzle 26 were not moving. This is a result of the fact that the camera is attached to the moving structure of placement nozzle platform 22 and so is not in motion relative to the nozzle 26, which is also attached to the same placement nozzle platform 22. According to this presently preferred embodiment of the present invention, the lack of apparent motion makes possible the use of a conventional camera without any need for specialized or strobed lighting. If this approach is not utilized, some other method of achieving a freeze frame or strobed image will be required in order to reduce or minimize the blur effect from motion between a stationary, upward looking camera or sensor (the traditional method). Using fixed strobes or shutters (both mechanical and electronic types) always introduces compromises to the path traveled by the manipulator, i.e., the nozzle 26 must carry the component over the camera and specialized illumination/shutter used to "freeze" the images. This causes a lengthening of the path of travel required to place components on the workpiece and results in reduced throughput. There are additional optical disadvantages to strobe illumination or shutters in that they dramatically reduce the available light used to capture the image, thereby reducing image quality and hence the precision to which the location of the component on the nozzle 26 may be calculated using machine vision techniques. The reflective method detailed here allows for normal methods of illumination and full frame time integration, thus yielding a high quality image.

It is preferred that as the nozzle 26 carrying component 10 passes by reflective surface 18, a signal is generated to cause the machine vision subsystem 34 (FIG. 6) to capture an image from camera 20. This can be done in any of a number of ways, but the simplest one is to have a signal beam (such as a light beam, inductive sensor, hall effect sensor, metal detector, or the like) that is broken or interrupted by the passing of nozzle 26. This signal would be arranged to fire when the camera 20, reflective surface 18 and nozzle 26 with component 10 are all in position so that an image of component 10 as reflected by reflective surface 18 will be "seen" by camera 20.

In accordance with this invention, a conventional machine vision subsystem 34, well known to those of ordinary skill in the art, is utilized to take images captured from camera 20 of bottom side 24 of component 10 while component 10 is disposed over reflective surface 18, process those images, and determine a $\Delta x$, $\Delta y$ and a $\Delta \theta$ value for the component representing, respectively, a deviation along the x-axis, a deviation along the y axis and a deviation about the z-axis from a nominal alignment of the component with a predetermined position axis. This particular component in-flight registration concept is significant because it allows the in-flight registration of semiconductor parts having high density pins or leads and particularly flip-chip parts which employ a high density array of conductive bumps to form contacts with a conductive array of traces on a printed circuit board or other substrate. This invention is also significant because it provides a significantly lower cost alternative to the blocked light-beam based sensor systems presently used to align and position component parts in pick and place systems.

Figure 2:
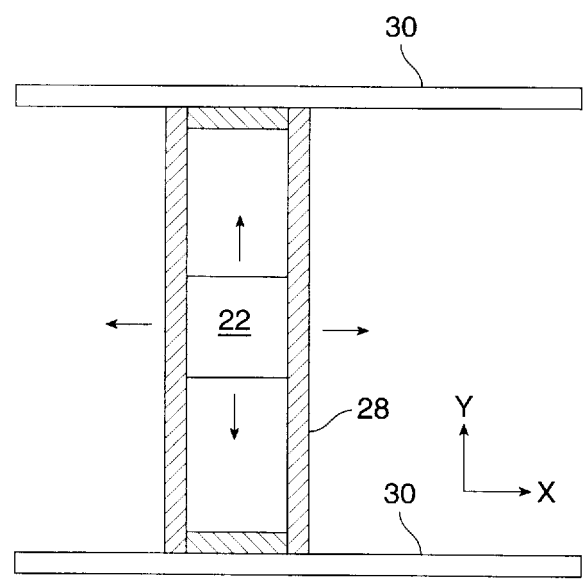
FIG. 2 is a diagram showing a top view of a pick and place machine according to a presently preferred embodiment of the present invention.

FIG. 2 depicts a top view of a pick and place machine according to a presently preferred embodiment of the present invention. Component placement nozzle platform 22 is positioned along the y-axis by y-stage gantry 28. Y-stage gantry 28 is positioned along the x-axis by x-stage gantry 30 in a conventional manner well known to those of ordinary skill in the art.

Figure 3:
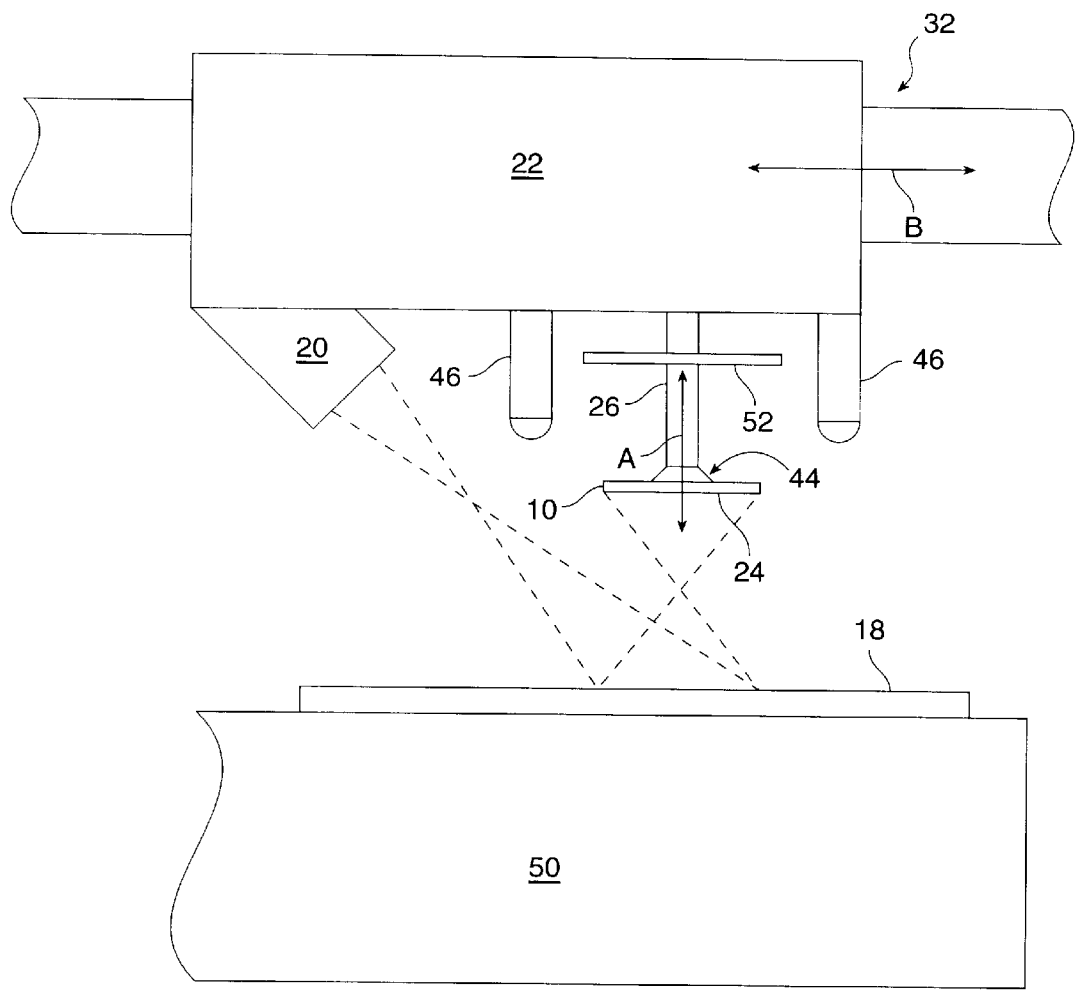
FIG. 3 is a diagram showing a detailed side view of the apparatus for in-flight component registration according to a presently preferred embodiment of the present invention.
Figure 6:
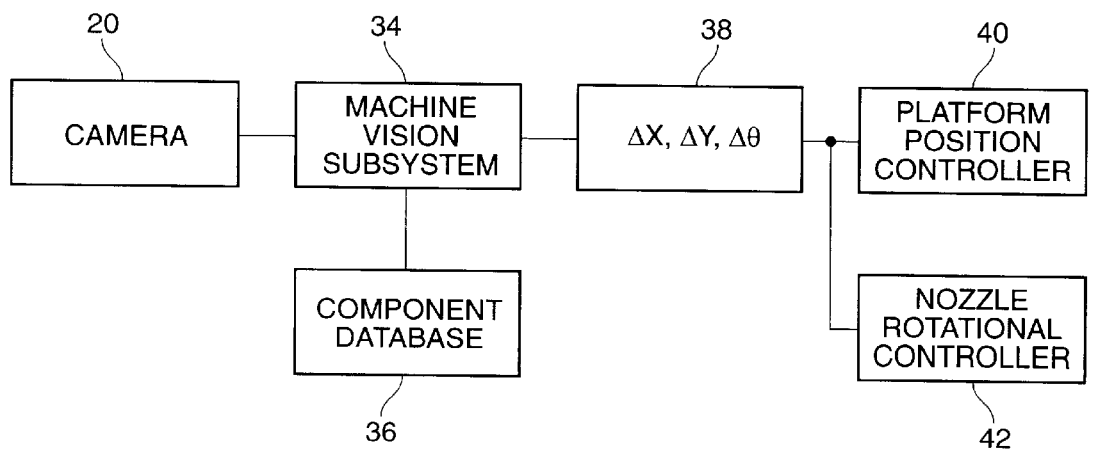
FIG. 6 is a block diagram showing how the imaging system controls the positioning system according to a presently preferred embodiment of the present invention.

Referring now to FIG. 3, the in-flight component registration apparatus 32 according to the present invention includes a camera 20 which is preferably a CCD-type miniature camera. Low mass is important so that a high speed of motion can be achieved by component placement nozzle platform 22 which supports camera 20 as shown. Turning now to FIG. 6, it can be seen that camera 20 obtains an image of the bottom side 24 of component 10 while the image is reflected into camera 20 by reflective surface 18 and that image is passed to machine vision subsystem 34 where it is preferably digitized and processed. Machine vision subsystem 34 preferably obtains component data from a component database 36 based upon what component it is expecting to have on the nozzle at a given moment. The machine vision subsystem 34 may compare the image of component 10 acquired "in flight" against the component database 36 and reject the component if it does not conform to the information in the database (e.g., wrong component picked up, dirt or paper particle picked up, missing features, features beyond prescribed tolerances, component appears damaged, etc.). This function is a significant advantage over the current perimeter silhouette methods (such as those used by CyberOptics Corporation of Minneapolis, Minn.—see, e.g., U.S. Pat. No. 5,278,634 incorporated herein by reference as if set forth fully herein). If component defects are present, then, in accordance with the present invention, the defective or incorrect part will be deposited in a reject bin or similar receptacle rather than on the workpiece.

Assuming that the component 10 meets requirements, the machine vision subsystem 34 will calculate and output values for $\Delta x$, $\Delta y$ and $\Delta \theta$ at block 38 of FIG. 6. These values are then passed to the platform position controller 40 and/or nozzle rotational controller 42 as appropriate in order to reposition the platform (and/or workpiece) and rotate the nozzle (and/or workpiece) so that when placed, the component 10 will be placed exactly where desired on workpiece 14. The platform position controller and nozzle rotational controller are conventional systems well known to those of ordinary skill in the art and found in most pick and place systems.

Operation of machine vision systems is well known to those of ordinary skill in the art. A brief overview will be presented to explain the operation of the machine vision subsystem 34 in the context of the present invention. Registration of components using features of interest is commonly performed using machine vision. Features of interest are those two or three dimensional objects on the surface of the component that accurately relate the precise locations of the interconnections to be aligned with the mating substrate interconnect features. The method of extracting the geometrical (usually a cartesian x, y) location of any feature would most frequently use the following or a similar procedure:

(a) Digitize the two dimensional image from the camera 20 on the basis of relative intensity of each light sensitive camera element (or pixel). The normal practice is to assign a value of 0–256 (8 bit) for the darkest to the brightest values as captured by camera 20 and assign the proper value to each pixel in a camera matrix (typically 512×512 pixels). The total data for a single picture is a total of 8 bits each pixel in the camera matrix (e.g., 8×512×512 or 2 Mb).

(b) Machine vision methods are used to identify and calculate coordinates of the registration features of component 10. This is accomplished by scanning the digitized data array with a mathematical filter (e.g., the Sobel operator, the difference of gaussian, or other rate of change algorithm), and generate a new data array indicating those regions that contain a rapid rate of change of illumination, or "edges". The literature contains volumes of well known techniques for extracting edge information from digitized information.

(c) As an alternative to step (b), the image may first be scanned with a normalizing operator and then matched with an existing image, or template, that holds an image of a single feature of interest. This method requires that the template image be correlated with each pixel by pixel group of equal dimension to the template. In this method, a correlation score is calculated for each location of the template, row by column, over the entire digitized image. This technique is known as normalized correlation and is also well known to those of ordinary skill in the art.

(d) Machine vision methods are used to identify and calculate coordinates of the registration features of component 10. The typical algorithms for generating the coordinate image of the significant features of component 10 include any combination of connectivity of thresholded edges, chain coding, projection, normalized correlation to a trained template, edge extraction following by feature fitting, or pixel counting. The apparent dimensions of the located component features are corrected using the linear perspective distortion and spatial factors calibration methods mentioned above. This calculation is then compared to the edge configuration or feature set and geometry of the ideal feature of interest. If a group of edges or correlated features have geometric characteristics within a toleranced range of the ideal parameter for the feature of interest, then this part of the image is labelled and its location reported for use (e.g., in cartesian x,y coordinates stated in metric units). The true center and orientation of component 10 may be reported to the platform position controller 40. The corrected placement location is calculated and the component placement nozzle platform 22 changes its position so as to place a component with an offset coordinate to reflect the feature location of the component 10 on tip 44 of nozzle 26. Alternatively, the position of workpiece 14 may be adjusted so that a component with an offset coordinate may be placed in the desired location on the workpiece. The pick-and-place mechanism or the workpiece, or both, adjusts if the component has an offset coordinate based on control signals generated by the platform position controller 40 and/or nozzle rotational controller 42, as desired.

In implementing a machine vision subsystem for the present invention, it is presently preferred that machine vision systems sold by the Juki Corporation of Tokyo, Japan; Datacube, Inc. of Danvers, Mass; Adept Technology, Inc. of San Jose, Calif; Cognex of Needham, Mass; AISI of Ann Arbor, Mich. or other well known purveyors of such systems be used.

Turning again to FIG. 3, a nozzle 26 preferably uses a switched vacuum source (not shown) to grasp component 10 as desired. Switching on the vacuum source with a conventional electrically operated valve permits the nozzle 26 to grasp component 10 as desired. Switching off the vacuum source will release the component 10 from the tip 44 of the nozzle 26. Nozzle 26 is movable up and down in a vertical direction (along the z-axis) as indicated by Arrow A (FIGS. 3, 5) by means of conventional linear actuators or other similar devices.

In normal use, then, the component placement nozzle platform 22 is first positioned over the component supply source 12. Tip 44 of nozzle 26 is lowered into contact or near contact with component 10 (FIG. 1). The vacuum supply is switched on and component 10 is picked up by nozzle 26. Nozzle 26 is then moved up and component placement nozzle platform 22 is displaced over reflective surface 18 in a direction of travel toward workpiece 14. While over reflective surface 18, illuminating lights 46 are preferably switched on to aid in illuminating component 10. While over reflective surface 18, camera 20 captures an image of the bottom side 24 of component 10 which is passed to the machine vision subsystem 34 as described above. The component placement nozzle platform 22 continues to move toward the desired component placement position on workpiece 14 whereupon the correction values $\Delta x$, $\Delta y$ are applied to the platform location (and/or workpiece location) and the angular displacement correction $\Delta \theta$ is applied to the rotational controller of nozzle 26 (and/or workpiece location). Now, perfectly positioned over the workpiece, nozzle 26 is lowered so that component 10 is in contact or near contact with workpiece 14, then vacuum is removed from the nozzle 26 and the nozzle is raised leaving component 10 placed on the workpiece 14 as desired. The steps hereinbefore explained are now repeated until all components to be placed onto the workpiece are removed from the component supply source 12 and placed on the workpiece 14.

Figure 4:
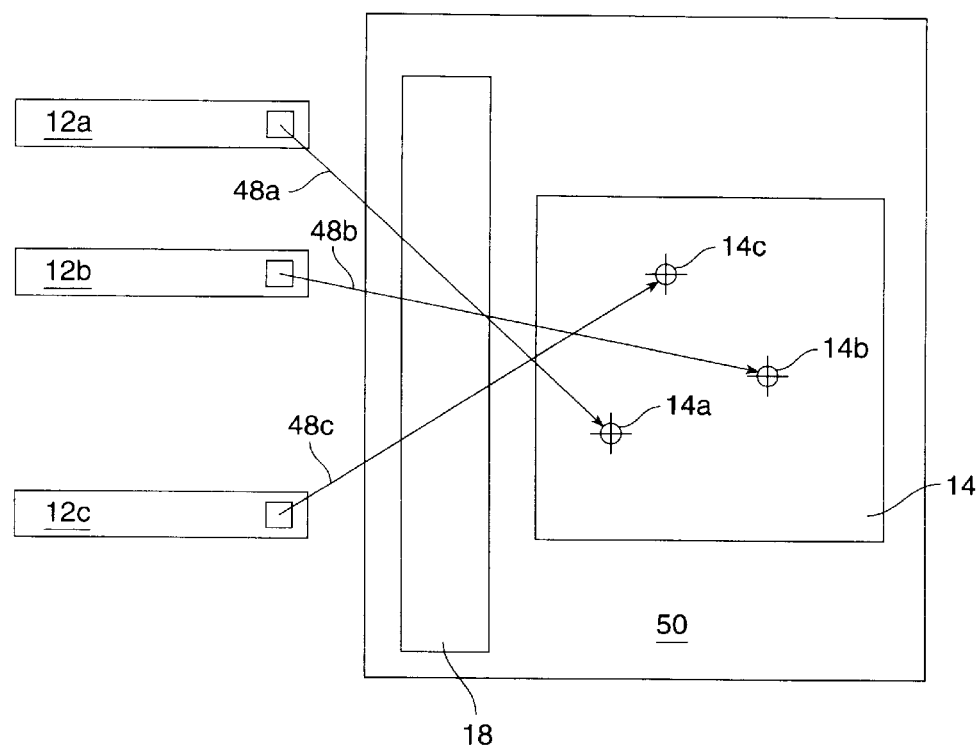
FIG. 4 is a diagram showing the paths of flight of the components from the component supply source to respective assembly locations on the workpiece according to a presently preferred embodiment of the present invention.

In operation, component 10 is picked from component supply sources 12a, 12b and 12c (FIG.4) by nozzle 26 and preferably lifted by nozzle 26 to a standard height relative to the surface of reflective surface 18 that is fixed to machine base 50. The height of component 10 during transport thereof over reflective surface 18 determines the focus for the optics of camera 20. Once set, the focus should remain correct for all components carried over reflective surface 18 at the same height. Component 10 is carried by nozzle 26 above the surface of reflective surface 18 at the constant fixed focus height stated above and along the exemplary paths 48a, 48b and 48c that cross the surface of reflective surface 18. As shown in FIG. 4, the path of component 10 from supply sources 12a, 12b and 12c to assembly locations 14a, 14b and 14c must go across fixed reflective surface 18 so as to allow the opportunity for camera 20 to capture the image of the bottom side 24 of component 10 while in-flight over fixed reflective surface 18.

Note that while the simplest way to implement the present invention is probably to place reflective surface 18 parallel to the plane of the workpiece and facing up, there is no requirement that this be done and other orientations which permit an image of the bottom surface 24 of component 10 to be captured while nozzle 26 is traveling from component supply source 12 to workpiece 14 would also work. The key is that the reflective surface 18 permits the bottom surface 24 of component 10 to be imaged by a camera 20 carried by the same platform which is carrying the component 10. If desired, auto-focus capability or a wide depth of focus could be added to remove the requirement that the components always transit the mirror at a fixed distance from the mirror.

Referring now to FIG. 4, nozzle 26 is used to grasp, as described before, components from various component supply sources 12a, 12b and 12c and to transport the components to assembly locations 14a, 14b and 14c on workpiece 14 along respective paths 48a, 48b and 48c as shown. It is to be noted that this invention only requires that paths 48a, 48b and 48c pass over reflective surface 18 there is no requirement that they do so in a shortest distance linear path as shown, although this is presently preferred.

Component supply sources 12a, 12b and 12c may include component supply feeders, magazines, storage bins, or the like. It is understood that a number of additional auxiliary handling means related to the operation of supply sources 12a, 12b and 12c may be provided as well known to those of ordinary skill in the art. Such means are not shown in the drawings and the design thereof may be chosen by any persons of ordinary skill in the art to suit their needs. Assembly locations 14a, 14b and 14c may be part of workpiece 14, which can be a printed circuit board, a substrate (e.g., of epoxy resin, ceramic material, or the like), or any other workpiece intended for the manufacturing of an electronic circuitry. The surface of workpiece 14 is normally equipped with a certain pattern of electrically conductive traces and with a plurality of connecting points provided to receive discrete electrical or electronic components, including resistors, capacitors, transistors, integrated circuits and other electrical components and assemblies for electrical attachment thereto.

Referring back to FIG. 3, component placement nozzle platform 22 moves in an x-y cartesian plane and is used to carry the nozzle 26 from component supply sources 12a, 12b and 12c to assembly locations 14a, 14b and 14c. Illuminating lights 46 supply light for camera 20 and may be devices that can be switched on for a short duration in order to expose the camera 20 rapidly, thereby reducing the width required for fixed reflective surface 18 used in the present invention. Optical shield 52, located about nozzle 26, allows for optical isolation of the component 10's image from nozzle 26 and the mechanism of component placement nozzle platform 22. Component 10 has features of interest that must be imaged in order to obtain the position information for component 10. These features must be visible from the side facing the surface of fixed reflective surface 18. These features may include the perimeter edge, surface features, printed features, topological or bump features, or any other visually perceivable element of component 10 that may be used to dimensionally locate the component and determine its deviation from the desired nominal position axis (e.g., parallel to line "A" in FIG. 3). Reflective surface 18 has a fully optically reflective surface that is parallel to the plane of motion of component placement nozzle platform 22. Reflective surface 18 returns to camera 20 an image of the bottom side 24 of component 10 held by nozzle 26. Camera 20, nozzle 26, illuminating lights 46, optical shield 52, and component 10 move along with component placement nozzle platform 22, as shown by Arrow B in FIG. 3.

By use of distance, timing, or an external trip signal, camera 20 is set to integrate and capture the image of component 10, as seen on reflective surface 18 while component 10 is over the imaging zone as defined by reflective surface 18. The timing of the "image capture" is critical and must be linked to the positional controller of component placement nozzle platform 22 and to the "image capture" function of the machine vision subsystem 34. Normally, camera image synchronization is an integral part of a machine vision system. The period of image integration is determined as a function of the available illumination, the speed of flight over reflective surface 18, and the width of reflective surface 18. For example, an image integration of 10 milliseconds would be adequate for a component transport velocity of 1 meter/second over a reflective surface that is 10 mm wide. Other dimensions and speeds could also be used as desired.

Figure 5:
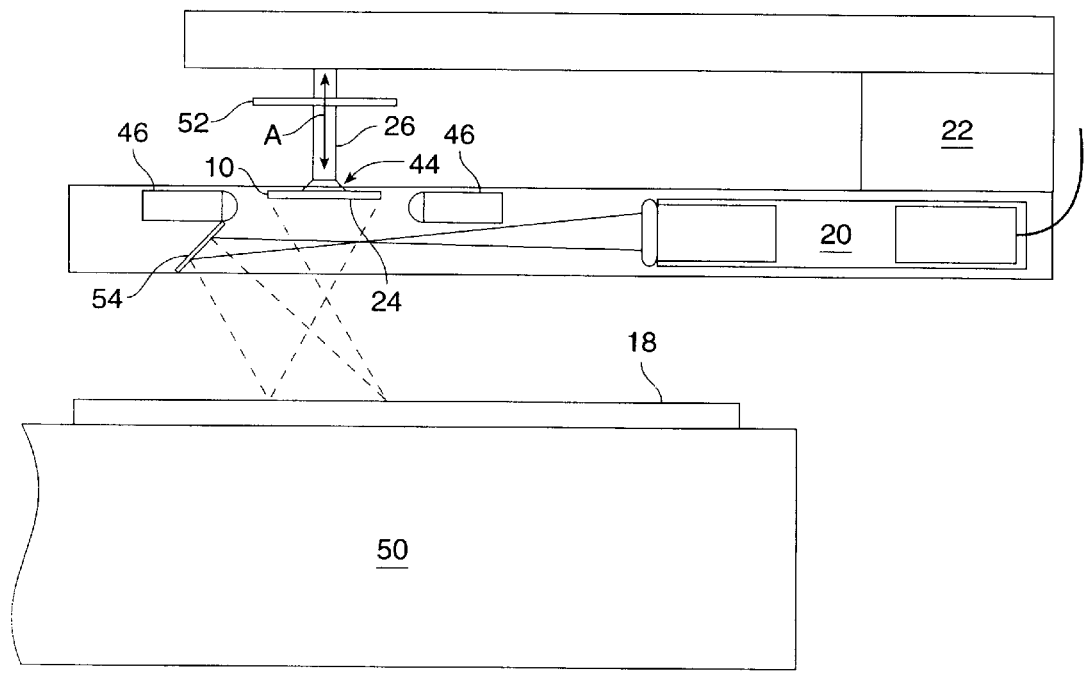
FIG. 5 is a diagram showing a detailed side view of the apparatus for in-flight component registration according to a presently preferred alternative embodiment of the present invention.

An alternative preferred embodiment of the present invention is depicted in FIG. 5. According to FIG. 5, rather than have camera 20 point down, camera 20 points in a direction parallel to the direction of travel of component placement nozzle platform 22. An optical flat or mirror 54 is used to fold the image paths of the optics as shown. The advantage of this alternative embodiment is that of reduced vertical size for the sensor package, allowing it to be implemented as a direct replacement for existing technology and highly compact blocked-light sensor packages such as those manufactured by CyberOptics Corporation of Minneapolis, Minn.

Other arrangements may be used, for example, reflective surface 18 could be located in a fixed position above machine base 50.

The center of nozzle 26 is preferably calibrated relative to the field of view of camera 20. Calibration may be achieved according to a presently preferred embodiment of the present invention by using a target with fiducial marks visibly placed on the bottom of the target component. In order to obtain the true center of the tip 44 of nozzle 26, the calibration method would preferably take two images of the fiducial marks at rotations of 180 degrees. The coordinate value of the location of the center of tip 44 of nozzle 26 (in the field of view of camera 20) is calculated and stored in order to calibrate the camera 20 field of view. Also calibrated is the physical spatial dimension of camera 20. The dimensions can be expressed, for example, as the millimeter to pixel ratio, as determined by known feature dimensions of a target.

The camera field of view is further calibrated on the basis of the "linear perspective distortion factor", which indicates the slope of the camera imaging plane relative to the plane of component 10. This factor will be used to correct for distortion of the apparent image size of component 10 across the image plane of camera 20. This distortion is introduced because image viewing of component 10 is performed at a non-orthogonal angle. The linear perspective distortion factor is stored for use by the machine vision subsystem 34, as known to those of ordinary skill in the art, to allow for calculation of the true locations of component features. The linear perspective distortion factor may be calculated using the calibration technique described above when calibrating the center of nozzle 26 relative to the field of view of camera 20. Alternatively, the linear perspective distortion factor may be pre-determined as a function of the optics and the mechanical relationship of camera 20 to the imaging plane at which component 10 will be positioned.

In accordance with the above-described invention the following key advantages will be realized over existing blocked-light technologies:

(a) Flip-chip components can be registered using bumps or die pattern, the most reliable way—this is not possible with laser or blocked-light methods because the features of interest have almost no height dimension and would not occult a plane of illumination. Die patterns and very low profile flip-chip bumps are best located using an optical image rather than by using a blocked-light alignment strategy. As the use of flip-chip components increases, this will become more critical.

(b) Since most pick and place machines already have a vision system with a camera placed on the nozzle platform in order to meet the requirements of registration of the substrate location, the same hardware can easily be multiplexed to perform component registration as well since this is an activity that occurs at another point in time relative to component registration. This will result in significant cost reduction as no separate system is now required to perform component alignment.

(c) Heat is generated by existing laser-based blocked-light systems which can adversely affect the accuracy of calibrations made by that type of sensor. Low heat and intermittent illumination used only at the time of observation allows the present invention to obtain a highly stable calibration, unaffected by heat induced mechanical drift.

(d) Expensive diode laser elements used in existing blocked-light sensors can be replaced by much less expensive and more conventional illumination sources.

(e) The elimination of laser elements eliminates eye safety concerns and protection requirements and regulations.

(f) Low cost optics can be employed rather than specialized narrow bandwidth optics which are used with laser-based sensor systems.

ALTERNATIVE EMBODIMENTS

Although illustrative presently preferred embodiments and applications of this invention are shown and described herein, many variations and modifications are possible which remain within the concept, scope, and spirit of the invention, and these variations would become clear to those of skill in the art after perusal of this application. The invention, therefore, is not to be limited except in the spirit of the appended claims.

What is claimed is:

1. A method of positioning a component in a selected position on a workpiece, said method comprising the steps of:

removing the component from a component storage means;

transporting the component from the component storage means into the region of the workpiece by component transporting means, said component transporting means having a positioning axis, and the component having a predetermined nominal position relative to the positioning axis;

moving the component transporting means to position said positioning axis in a predetermined position relative to the workpiece;

detecting the actual position of the component relative to the positioning axis of said component transporting means and measuring the deviation of said actual position of the component from the predetermined nominal position thereof relative to the positioning axis while the component is spaced from the workpiece, said detecting step carried out by a camera directed at a reflective surface in turn directed at the component so as to image the component with said camera by means of reflecting an image of said component into said camera with said reflective surface;

generating a control signal in response to a deviation of the actual position of the component from the predetermined nominal position thereof relative to the positioning axis;

changing the position of the positioning axis of the component transporting means with respect to the workpiece in response to the control signal to thereby change the actual position of the component so that it coincides with the preset position thereof on the workpiece, and thereafter positioning the component on the workpiece.

2. A method according to claim 1 wherein changing the position of the positioning axis of said component transporting means is effected by displacing said component transporting means.

3. A method according to claim 1 wherein changing the position of the positioning axis of said component transporting means is effected by displacing the workpiece.

4. A method according to claim 1 wherein changing the position of the positioning axis of said component transporting means is effected by displacing said component transporting means and the workpiece.

5. A method according to claim 1 wherein said positioning axis of said component transporting means extends in a vertical direction and said deviation between the actual position and the predetermined nominal position of the component relative to the positioning axis is measured in at least one direction within a horizontal plane.

6. A method according to claim 1 wherein said positioning axis of said component transporting means extends in a vertical direction and said deviation between the actual position and the predetermined nominal position of the component relative to the positioning axis is measured in two directions, perpendicular to each other, within a horizontal plane and by an angle of rotation about the positioning axis.

7. A method according to claim 1 wherein said positioning axis of said component transporting means extends in a vertical direction and said deviation between the actual position and the predetermined nominal position of the component relative to the positioning axis is measured with regard to said positioning axis.

8. An apparatus for positioning a component on a workpiece in a selected position, said apparatus comprising:

a workpiece receiving and retaining means for receiving and retaining a workpiece, storage means containing the component to be positioned onto the workpiece;

component transporting means displaceable between said storage means and said workpiece receiving and retaining means and comprising a pickup retaining member adapted to pick up and remove the component from said storage means and to retain it during transportation thereof to the workpiece, said component transporting means having a positioning axis, and the component having a predetermined nominal position relative to the positioning axis;

means for moving said component transporting means to position said positioning axis in a predetermined position relative to said workpiece receiving and retaining means;

position detection means for detecting an actual position of the component relative to the positioning axis of the component transporting means, for measuring a deviation of said actual position of the component from the predetermined nominal position thereof relative to the positioning axis, and for generating a control signal in response to a deviation of said actual position of the component relative to the positioning axis from the predetermined nominal position thereof relative to the positioning axis, said position detection means including imaging means moveable with said component transporting means and a reflective surface not attached to said component transporting means for reflecting an image of the component into said imaging means during displacement of said component transporting means; and control means for effecting a change in the position of the positioning axis in response to said control signal to thereby change the actual position of the component so that it coincides with the preset position thereof on the workpiece.

9. An apparatus according to claim 8 wherein said workpiece receiving and retaining means and said component pickup and retaining member are vertically spaced, and said imaging means is arranged at a certain distance above said workpiece receiving and retaining means and beside said component pickup and retaining member, and being positioned essentially over and facing said workpiece receiving and retaining means and adjacent said pickup and retaining member.

10. An apparatus according to claim 8, further comprising:

means for determining the position of said component transporting means over the workpiece, said means including said imaging means and predetermined features placed on the workpiece.

11. An apparatus for positioning a component from a component supply source to a selected position on a workpiece, said apparatus comprising:

a workpiece receiving and retaining member for receiving and retaining the workpiece;

component transporting means displaceable between the component supply source and the workpiece receiving and retaining member, said component transporting means including a pickup retaining member adapted to pick up and remove the component from the component supply source and to retain the component during displacement thereof between the component supply source and the workpiece, said component transporting means including a platform, said pickup retaining member attached to said platform, said component transporting means having a positioning axis and said component having a predetermined nominal position relative to the positioning axis of said component transporting means;

an adjusting device for moving said component transporting means to position said positioning axis in a predetermined position relative to said workpiece receiving and retaining member;

a reflective surface mounted beneath said component transporting means and between the component supply source and the workpiece, said reflective surface oriented to reflect an image of an actual position of said component relative to the positioning axis of said component transporting means toward said platform while said platform is disposed in proximity to said reflective surface; and a camera attached to said platform and adapted to capture said image at a selected moment.

12. An apparatus according to claim 11, further comprising:

a background surface positioned adjacent to said pickup retaining member, said background surface adapted to isolate an image of the component from said pickup retaining member and said component transporting means.

13. An apparatus according to claim 11, further comprising:

a plurality of illuminators disposed from said platform for illuminating the component during exposure of said camera during said selected moment.

14. An apparatus according to claim 11, further comprising:

a controller for effecting a change in the position of said positioning axis in response to said control signal to thereby change the actual position of said component so that it coincides with the selected position thereof on the workpiece.

15. An apparatus according to claim 11 wherein said workpiece receiving and retaining member and said pickup retaining member are vertically spaced.

16. An apparatus according to claim 11 wherein said reflective surface is adapted to provide a continuous, non-varying image of the component as the component is displaced over said reflective surface.

17. An apparatus according to claim 11, further comprising:

a mirror mounted to said platform and in the optical path between said reflective surface and said camera.

18. A method of positioning a component in a selected position on a workpiece, said method comprising the steps of:

removing the component from a component storage means;

transporting the component from the component storage means into the region of the workpiece by component transporting means, said component transporting means having a positioning axis, and the component having a predetermined nominal position relative to the positioning axis;

moving the component transporting means to position said positioning axis in a predetermined position relative to the workpiece;

causing the component transporting means to pass by a reflective surface on its way from the component storage means to the workpiece;

generating a signal to cause a camera to store an image of the component when the image of the component is viewable by the camera in the reflective surface;

using the image to detect the actual position of the component relative to the positioning axis of said component transporting means and measuring the deviation of said actual position of the component from the predetermined nominal position thereof relative to the positioning axis while the component is spaced from the workpiece;

generating a control signal in response to a deviation of the actual position of the component from the predetermined nominal position thereof relative to the positioning axis;

changing the position of the positioning axis of the component transporting means with respect to the workpiece in response to the control signal to thereby change the actual position of the component so that it coincides with the preset position thereof on the workpiece; and thereafter positioning the component on the workpiece.

19. The method according to claim 18 wherein the step of changing the position of the positioning axis of the component transporting means with respect to the workpiece is effected by displacing the component transporting means.

20. The method according to claim 18 wherein the step of changing the position of the positioning axis of the component transporting means with respect to the workpiece is effected by displacing the workpiece.

21. The method according to claim 18 wherein the step of changing the position of the positioning axis of the component transporting means with respect to the workpiece is effected by displacing the component transporting means and the workpiece.

* * * * *